(12) United States Patent
Won et al.

(10) Patent No.: US 10,424,695 B2
(45) Date of Patent: Sep. 24, 2019

(54) EMISSIVE NANOCRYSTAL PARTICLE, METHOD OF PREPARING THE SAME AND DEVICE INCLUDING EMISSIVE NANOCRYSTAL PARTICLE

(71) Applicant: SAMSUNG ELECTRONICS CO., LTD., Suwon-si, Gyeonggi-do (KR)

(72) Inventors: Yuho Won, Seoul (KR); Jihyun Min, Seoul (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/841,876

(22) Filed: Dec. 14, 2017

(65) Prior Publication Data

US 2018/0163129 A1 Jun. 14, 2018

(30) Foreign Application Priority Data

Dec. 14, 2016 (KR) .......................... 10-2016-0170195

(51) Int. Cl.
*H01L 33/50* (2010.01)
*C09K 11/88* (2006.01)
(Continued)

(52) U.S. Cl.
CPC ............ *H01L 33/501* (2013.01); *C09K 11/02* (2013.01); *C09K 11/025* (2013.01); *C09K 11/70* (2013.01); *C09K 11/883* (2013.01); *H01L 21/02601* (2013.01); *H01L 31/0232* (2013.01); *H01L 31/02322* (2013.01); *H01L 31/02325* (2013.01); *H01L 31/0384* (2013.01); *H01L 31/1055* (2013.01); *H01L 33/08* (2013.01);
(Continued)

(58) Field of Classification Search
CPC .......... H01L 21/02601; H01L 31/0232; H01L 31/02322; H01L 31/02325; H01L 31/02327; H01L 31/0384; H01L 31/03845; H01L 31/055; H01L 33/50; H01L 33/501; H01L 33/502; H01L 33/504; H01L 33/505; C09K 11/00; C09K 11/08
See application file for complete search history.

(56) References Cited

U.S. PATENT DOCUMENTS 6,322,901 B1 11/2001 Bawendi et al.
6,861,155 B2 3/2005 Bawendi et al.
(Continued)

FOREIGN PATENT DOCUMENTS

EP 2853578 A1 4/2015
KR 1020070058072 A 6/2007
(Continued)

OTHER PUBLICATIONS

Extended European Search Report dated May 2, 2018, of the corresponding European Patent Application No. 17206816.5.
(Continued)

*Primary Examiner* — Eduardo A Rodela
(74) *Attorney, Agent, or Firm* — Cantor Colburn LLP

(57) ABSTRACT

An emissive nanocrystal particle includes a core including a first semiconductor nanocrystal including a Group III-V compound and a shell including a second semiconductor nanocrystal surrounding the core, wherein the emissive nanocrystal particle includes a non-emissive Group I element.

37 Claims, 6 Drawing Sheets

(51) Int. Cl.
  *H01L 31/0232* (2014.01)
  *H01L 31/0384* (2006.01)
  *H01L 31/105* (2006.01)
  *H01L 21/02* (2006.01)
  *C09K 11/02* (2006.01)
  *C09K 11/70* (2006.01)
  *H01L 33/08* (2010.01)
  *F21V 8/00* (2006.01)
  *G02F 1/1335* (2006.01)
  *B82Y 20/00* (2011.01)
  *B82Y 40/00* (2011.01)
  *H01L 33/06* (2010.01)

(52) U.S. Cl.
  CPC ............ *H01L 33/50* (2013.01); *H01L 33/502* (2013.01); *H01L 33/504* (2013.01); *H01L 33/505* (2013.01); *B82Y 20/00* (2013.01); *B82Y 40/00* (2013.01); *G02B 6/005* (2013.01); *G02B 6/0053* (2013.01); *G02B 6/0055* (2013.01); *G02B 6/0068* (2013.01); *G02B 6/0073* (2013.01); *G02F 1/133621* (2013.01); *G02F 2001/133614* (2013.01); *G02F 2202/36* (2013.01); *H01L 33/06* (2013.01); *Y10S 977/774* (2013.01); *Y10S 977/818* (2013.01); *Y10S 977/824* (2013.01); *Y10S 977/892* (2013.01); *Y10S 977/896* (2013.01); *Y10S 977/95* (2013.01)

(56) References Cited

U.S. PATENT DOCUMENTS

| | | | |
|---|---|---|---|
| 7,105,051 B2 | 9/2006 | Peng et al. | |
| 7,427,523 B2 | 9/2008 | Boardman et al. | |
| 8,012,377 B2 | 9/2011 | Peng et al. | |
| 8,035,772 B2 | 10/2011 | Kim et al. | |
| 8,252,205 B2 | 8/2012 | Jun et al. | |
| 8,436,964 B2 | 5/2013 | Kim et al. | |
| 8,507,094 B2 * | 8/2013 | Woo | B01J 13/02 428/403 |
| 8,545,736 B2 | 10/2013 | Jun et al. | |
| 8,609,245 B2 | 12/2013 | Jang et al. | |
| 9,082,982 B2 | 7/2015 | Jun et al. | |
| 9,606,281 B2 | 3/2017 | Jang et al. | |
| 9,804,319 B2 | 10/2017 | Dubrow et al. | |
| 2007/0269991 A1 | 11/2007 | Jang et al. | |
| 2008/0012001 A1 * | 1/2008 | Gillies | C30B 7/00 257/9 |
| 2008/0138514 A1 | 6/2008 | Jang et al. | |
| 2008/0251781 A1 * | 10/2008 | Han | H01L 33/06 257/13 |
| 2008/0305334 A1 | 12/2008 | Jang et al. | |
| 2009/0134414 A1 * | 5/2009 | Li | B29C 39/006 257/98 |
| 2009/0302304 A1 * | 12/2009 | Peng | C09K 11/02 257/9 |
| 2010/0110728 A1 | 5/2010 | Dubrow et al. | |
| 2010/0283072 A1 | 11/2010 | Kazlas et al. | |
| 2012/0113671 A1 | 5/2012 | Sadasivan | |
| 2012/0113672 A1 | 5/2012 | Dubrow et al. | |
| 2012/0205586 A1 * | 8/2012 | Ren | C01B 25/08 252/301.36 |
| 2014/0117292 A1 | 5/2014 | Jun et al. | |
| 2015/0083969 A1 | 3/2015 | Kim et al. | |
| 2015/0109814 A1 * | 4/2015 | Chen | G02B 6/0073 362/606 |
| 2015/0218442 A1 | 8/2015 | Jun et al. | |
| 2015/0287878 A1 | 10/2015 | Ono et al. | |
| 2015/0300600 A1 | 10/2015 | Dubrow et al. | |
| 2016/0005932 A1 | 1/2016 | Lee et al. | |
| 2016/0202548 A1 * | 7/2016 | Lee | G02B 5/201 349/43 |
| 2016/0363713 A1 | 12/2016 | Dubrow et al. | |
| 2017/0176815 A1 | 6/2017 | Jang et al. | |
| 2018/0094190 A1 | 4/2018 | Kim et al. | |
| 2018/0216003 A1 * | 8/2018 | Zhang | B82Y 20/00 |

FOREIGN PATENT DOCUMENTS

| | | |
|---|---|---|
| KR | 1020070110995 A | 11/2007 |
| KR | 100839727 B1 | 6/2008 |
| KR | 1020080093539 A | 10/2008 |
| KR | 1020080107578 A | 12/2008 |
| KR | 1020090078547 A | 7/2009 |
| KR | 1020130044071 A | 5/2013 |
| KR | 1020130120486 A | 11/2013 |
| KR | 1020140032811 A | 3/2014 |
| KR | 1020140056500 A | 5/2014 |
| KR | 101462658 B1 | 11/2014 |
| KR | 1020150034621 A | 4/2015 |
| KR | 101525524 B1 | 5/2015 |
| KR | 101525525 B1 | 5/2015 |
| KR | 1020160003503 A | 1/2016 |
| WO | 2011003003 A1 | 1/2011 |

OTHER PUBLICATIONS

Jennifer L. Stenin et al., "Luminescent InP Quantum Dots with Tunable Emission by Post-Synthetic Modification with Lewis Acids", The journal of physical chemistry letters, DOI: 10.1021/acs.jpclett.6b00177, Mar. 21, 2016, pp. 1315-1320, 7 (7).

Shu Xu et al., "Rapid Synthesis of High-Quality InP Nanocrystals", Journal of the American Chemical Society, DOI: 10.1021/ja057676k, Jan. 7, 2006, pp. 1054-1055, 128 (4).

Office Action dated Jun. 5, 2018 of the corresponding Korean Patent Application No. 10-2017-0172590 with English Translation.

* cited by examiner

EMISSIVE NANOCRYSTAL PARTICLE, METHOD OF PREPARING THE SAME AND DEVICE INCLUDING EMISSIVE NANOCRYSTAL PARTICLE

CROSS-REFERENCE TO RELATED APPLICATION

This application claims priority to and the benefit of Korean Patent Application No. 10-2016-0170195 filed on Dec. 14, 2016, and all the benefits accruing therefrom under 35 U.S.C. § 119, the content of which is incorporated herein in its entirety by reference.

BACKGROUND

1. Field

An emissive nanocrystal particle, a method of preparing the same, and a device including the emissive nanocrystal particle are disclosed.

2. Description of the Related Art

Physical characteristics (e.g., energy bandgaps and melting points) of nanocrystal particles that are known as intrinsic characteristics may be controlled by changing the nanocrystal particle sizes, unlike bulk materials. For example, a semiconductor nanocrystal also known as a quantum dot is a semiconductor material having a crystal structure several nanometers in size. Such semiconductor nanocrystals have such a small size that the semiconductor nanocrystals have a large surface area per unit volume and exhibit quantum confinement effects, and thus have different physicochemical characteristics from the characteristics of the bulk material. That is, semiconductor nanocrystals may have various characteristics by controlling physical sizes thereof. Semiconductor nanocrystals may absorb light from an excitation source and may become excited, and may emit energy corresponding to their energy bandgaps.

Semiconductor nanocrystals may be synthesized using a vapor deposition method of metal organic chemical vapor deposition (MOCVD), molecular beam epitaxy (MBE), or the like, a wet chemical method of adding precursor materials to an organic solvent to grow crystals, or the like. In the wet chemical method, organic materials such as dispersing agents may be coordinated on, e.g., attached to, surfaces of semiconductor nanocrystals to control a crystal growth during the crystal growth, and thus uniformity of sizes and shapes of semiconductor nanocrystals may be easily controlled compared with the vapor deposition method.

Semiconductor nanocrystal materials having a core-shell structure may exhibit slightly enhanced quantum efficiency, but it may be desirable to develop technologies to enhance properties (such as quantum efficiency) of the nanocrystals.

SUMMARY

An embodiment provides an emissive nanocrystal particle having improved photoluminescence efficiency and particle uniformity.

An embodiment provides a method of preparing the emissive nanocrystal particle having improved photoluminescence efficiency and particle uniformity.

An embodiment provides a composite and a device including the emissive nanocrystal particle.

According to an embodiment, an emissive nanocrystal particle includes a core including a first semiconductor nanocrystal including a Group III-V compound and a shell including a second semiconductor nanocrystal surrounding the core, wherein the emissive nanocrystal particle includes a non-emissive Group I element.

The non-emissive Group I element may be present inside the core, in an interface between the core and the shell, or a combination thereof.

The non-emissive Group I element may be present in a doped state or in a form of a metal salt other than a halide salt.

The metal salt may include an inorganic metal salt including phosphate, nitrate, carbonate, or a combination thereof.

The metal salt may include an organic metal salt and the organic metal salt may include a metal carboxylate, a metal thiolate, or a combination thereof.

The non-emissive Group I element may be present in, e.g., substitute or be inserted into gaps of a crystal structure of the first semiconductor nanocrystal or may be present inside an interstice between lattices.

The non-emissive Group I element may include lithium, sodium, potassium, rubidium, cesium, or a combination thereof.

The non-emissive Group I element may be present in an amount of greater than or equal to about 0.05 mol and less than or equal to about 20 mol based on 100 mol of the first semiconductor nanocrystal. The non-emissive Group I element may be present in an amount of greater than or equal to about 0.03 parts by weight and less than or equal to about 20 parts by weight based on 100 parts by weight of the first semiconductor nanocrystal.

The non-emissive Group I element may be present in an amount of greater than or equal to about 0.001 mol and less than or equal to about 20 mol based on 100 mol of the emissive nanocrystal particle. The non-emissive Group I element may be present in an amount of greater than or equal to about 0.001 parts by weight and less than or equal to about 20 parts by weight based on 100 parts by weight of the emissive nanocrystal particle.

The Group III-V compound may further include a Group II element.

The Group III-V compound may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The shell may include a material including a Group III-V compound, a Group II-VI compound, a Group IV-VI compound, a Group IV compound, or a combination thereof.

The Group II-VI compound may include a binary element compound including CdSe, CdTe, ZnO, ZnS, ZnSe, ZnTe, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, the Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof, and the Group IV element or compound may include an elementary substance material including Si, Ge, or a combination thereof; or a binary element compound including SiC, SiGe, or a combination thereof.

The shell may include a material having a different composition from the first semiconductor nanocrystal and having a larger bandgap than the first semiconductor nanocrystal.

The shell may be a multi-layered shell having at least two layers wherein each of the layers has a different composition.

The multi-layered shell may include a first shell near or adjacent to the core and a second shell surrounding the first shell and a bandgap of the first shell may be larger than a bandgap of the core and less than a bandgap of the second shell.

In the multi-layered shell having at least two layers, an outer shell may have a larger bandgap than a shell near or adjacent to the core.

The emissive nanocrystal particle may further include a ligand compound attached to a surface of the emissive nanocrystal particle. The ligand compound may include $RCOOH$, $RNH_2$, $R_2NH$, $R_3N$, $RSH$, $R_3PO$, $R_3P$, $ROH$, $RCOOR'$, $RPO(OH)_2$, $R_2POOH$, wherein, R and R' are the same or different, and are independently a C1 to C24 alkyl group, a C2 to C24 alkenyl group, or a C6 to C20 aryl group, or a combination thereof.

The emissive nanocrystal particle may have a full width at half maximum (FWHM) of less than or equal to about 45 nanometers (nm) in its photoluminescent spectrum.

According to an embodiment, a method of preparing an emissive nanocrystal particle includes preparing a Group I element-containing first semiconductor nanocrystal, preparing the Group I element-containing first semiconductor nanocrystal including mixing a core precursor of a Group III element, a precursor of a Group I element, a ligand compound, and a solvent to obtain a first mixture, adding a core precursor of a Group V element to the first mixture, and heating the core precursor of the Group V element and the first mixture to prepare a Group I element-containing first semiconductor nanocrystal, mixing a core precursor of a Group III element, a ligand compound, and a solvent to obtain a first mixture, and adding a core precursor of a Group V element and a precursor of a Group I element to the first mixture, and heating the core precursor of the Group V element, the precursor of the Group I element, and the first mixture, or mixing a core precursor of a Group III element, a core precursor of a Group V element, a ligand compound, and a solvent and reacting the core precursor of the Group III element, the core precursor of the Group V element, the ligand compound, and the solvent to prepare a first semiconductor nanocrystal, adding a precursor of a Group I element to the first semiconductor nanocrystal, and heating the first semiconductor nanocrystal and the precursor of the Group I element;

mixing a first shell precursor of an element including a Group II element, a Group III element, a Group IV element, or a combination thereof, a ligand compound, and a solvent to obtain a second mixture; and adding the Group I element-containing first semiconductor nanocrystal and a second shell precursor of an element including a Group V element, a Group VI element, or a combination thereof to the second mixture and reacting the Group I element-containing first semiconductor nanocrystal, the second shell precursor, and the second mixture to prepare a second semiconductor nanocrystal.

The method may further include heating the first mixture and/or heating the second mixture.

The core precursor of the Group III element may include a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

The core precursor of the Group V element may include a nitride, nitric acid, ammonium nitrate, alkyl phosphine, arylphosphine, alkylsilylphosphine, arsenide, arsenic oxide, arsenic halide, arsenic sulfide, or arsenic sulfate.

The precursor of the Group I element may be a metal salt other than a halide salt of the Group I element. The Group I element may include lithium, sodium, potassium, rubidium, cesium, or a combination thereof.

The metal salt may be an inorganic metal salt including a phosphate, a nitrate, a carbonate, or a combination thereof.

The metal salt may be an organic metal salt and the organic metal salt may include a metal carboxylate, a metal thiolate, or a combination thereof.

The first mixture may further include a core precursor of a Group II element.

According to an embodiment, a composite includes a polymer matrix; and the emissive nanocrystal particle dispersed in the polymer matrix.

The composite may have a form of a film.

The polymer matrix may include a thiol-ene polymer, a (meth)acrylate polymer, a urethane resin, an epoxy resin, a vinyl polymer, a silicone resin, or a combination thereof.

According to an embodiment, a device including the emissive nanocrystal particle is provided.

The device includes a light source; and a photoconversion layer disposed on the light source, wherein the photoconversion layer includes the emissive nanocrystal particle.

The device may include a lower electrode, an upper electrode facing the lower electrode, and an emission layer between the lower electrode and the upper electrode, wherein the emission layer includes the emissive nanocrystal particle.

The emissive nanocrystal particle may have a narrow full width at half maximum (FWHM) of a photoluminescence spectrum and improved photoluminescence efficiency and particle uniformity.

DETAILED DESCRIPTION

Figure 1:
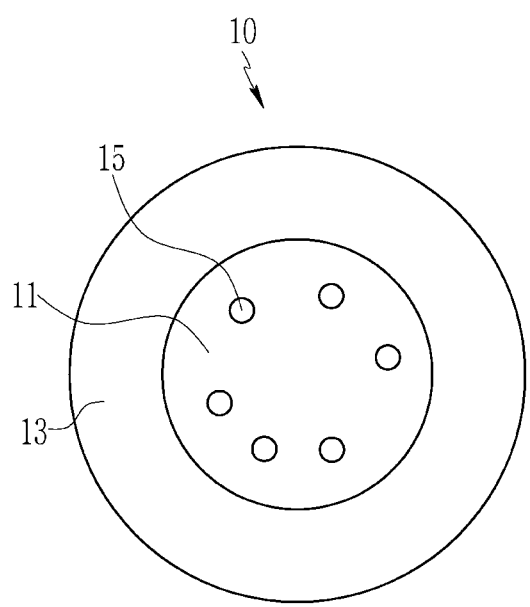
FIG. 1 is a schematic view of an exemplary embodiment showing an emissive nanocrystal particle.

This disclosure will be described more fully hereinafter in the following detailed description, in which some but not all embodiments of this disclosure are described. This disclosure may be embodied in many different forms and is not to be construed as limited to the embodiments set forth herein; rather, these embodiments are provided so that this disclosure will fully convey the scope of the invention to those skilled in the art. Thus, in some exemplary embodiments, well known technologies are not specifically explained to avoid ambiguous understanding of the present disclosure.

Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, "a combination thereof" refers to a mixture, a laminate, a composite, an alloy, a blend, a reaction product, or the like of an element.

Further, the singular includes the plural unless mentioned otherwise.

When a temporal relation in a manufacture process is illustrated by using for example, "after", "subsequently", "next," "before," or the like, a discontinuous case is included unless "right" or "directly" is mentioned.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "quantum efficiency (a quantum yield)" and "photoluminescence efficiency" may be used substantially equivalently.

As used herein, "Group I element" refers to a Group IA element and examples the Group I element may include Li, Na, K, Ru, and Cs but is not limited thereto.

As used herein, "Group II" refers to a Group IIA element and a Group IIB element and examples of the Group II element may include Cd, Zn, Hg, and Mg but are not limited thereto.

As used herein, "Group III" refers to a Group IIIA and a Group IIIB, and examples of the Group III metal may include Al, In, Ga, and TI, but are not limited thereto.

As used herein, "Group IV" refers to a Group IVA and a Group IVB, and examples of the Group IV element may include Si, Ge, and Sn but are not limited thereto.

As used herein, "alkyl" refers to a C1 to C30 alkyl, for example a C1 to C20 alkyl.

As used herein, "aryl" refers to a C6 to C36 aryl, for example a C6 to C12 aryl.

As used herein, "(meth)acryl" refers to both acryl and methacryl. An emissive nanocrystal particle according to an embodiment includes a non-emissive Group I element. Herein, the term of non-emissive refers to the element has no substantial influence on a maximum light emitting wavelength ($\lambda_{max}$) of the emissive nanocrystal particle.

Hereinafter, referring to FIGS. 1 and 2, the emissive nanocrystal particle according to an embodiment is illustrated.

Figure 2:
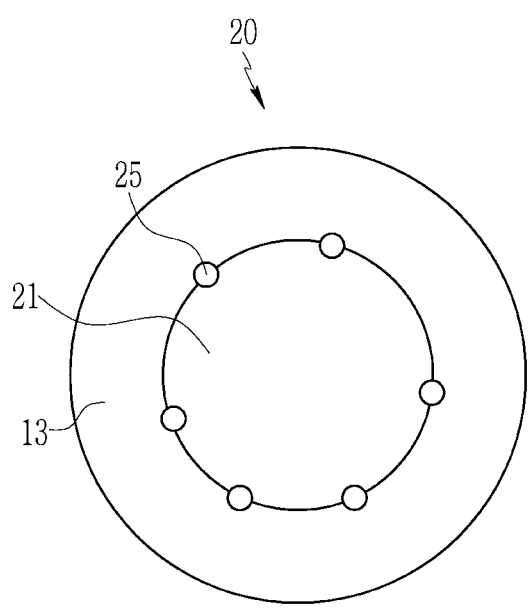
FIG. 2 is a schematic view of an exemplary embodiment showing an emissive nanocrystal particle.

FIG. 1 is a schematic view showing an emissive nanocrystal particle according to an embodiment, and FIG. 2 is a schematic view showing an emissive nanocrystal particle according to an embodiment.

Referring to FIG. 1, an emissive nanocrystal particle 10 according to an embodiment includes a core 11 including a first semiconductor nanocrystal and a shell 13 including a second semiconductor nanocrystal surrounding the core 11, wherein the first semiconductor nanocrystal includes a Group III-V compound and a non-emissive Group I element 15 is present inside the core.

Referring to FIG. 2, an emissive nanocrystal particle 20 according to an embodiment includes a core 21 including a first semiconductor nanocrystal and a shell 13 including a second semiconductor nanocrystal surrounding the core 21, wherein the first semiconductor nanocrystal includes a Group III-V compound and a non-emissive Group I element 25 is present in the interface of the core 21 and the shell 13.

The non-emissive Group I element may be all present inside of the core, or the non-emissive Group I element may be all present in the interface the core and the shell, or a plurality of the non-emissive Group I elements may be present both inside of the core and in the interface of the core and the shell.

The non-emissive Group I elements 15 and 25 may be doped or present as a metal salt other than a halide salt. The non-emissive Group I elements 15 and 25 may be present in or substituted or inserted into gaps of a crystal structure or present inside an interstice between lattices of the first semiconductor nanocrystal. The non-emissive Group I elements 15 and 25 may be present in the inside of the core, the interface between the core and the shell, or a combination thereof, to stabilize the first semiconductor nanocrystal and adjust a particle distribution to be uniform and thus improve photoluminescence efficiency.

The non-emissive Group I elements 15 and 25 are supplied into the first semiconductor nanocrystal by using a metal salt precursor material. When a metal halide is used as the metal salt precursor material, only halogen and not the metal (the non-emissive Group I elements 15 and 25) is present in the first semiconductor nanocrystal. Thus, in the embodiments, the metal salt should not be a metal halide.

Accordingly, the metal salt may be an inorganic metal salt including phosphate, nitrate, carbonate, or a combination thereof.

In addition, the metal salt may be an organic metal salt, and the organic metal salt may include metal carboxylate, metal thiolate, or a combination thereof. The presence of the Group I element 25 in the interface between the core 21 and the shell 13 may include presence in a thin interlayer or an interdiffusion region between the core 21 and the shell 13 as well as on the surface of the core 21.

The non-emissive Group I elements 15 and 25 may include lithium, sodium, potassium, rubidium, cesium, or a combination thereof.

The non-emissive Group I elements 15 and 25 may be included or present in an amount of less than or equal to about 20 mol based on 100 mol of the first semiconductor nanocrystal. The non-emissive Group I elements 15 and 25 may be included in an amount of greater than or equal to about 0.05 mol based on 100 mol of the first semiconductor nanocrystal. In an embodiment, the non-emissive Group I elements 15 and 25 may be included in an amount of about 0.05 mol to about 15 mol based on 100 mol of the first semiconductor nanocrystal. The non-emissive Group I elements 15 and 25 may be included in an amount of less than or equal to about 20 parts by weight based on 100 parts by weight of the first semiconductor nanocrystal. The non-emissive Group I elements 15 and 25 may be included in an amount of greater than or equal to about 0.03 parts by weight based on 100 parts by weight of the first semiconductor nanocrystal. Within the range, the non-emissive Group I elements 15 and 25 may complement a defect inside and/or on the surface of the first semiconductor nanocrystal and improve photoluminescence efficiency and particle uniformity of the emissive nanocrystal particles.

The non-emissive Group I elements 15 and 25 may be included in an amount of less than or equal to about 20 mol based on 100 mol of the emissive nanocrystal particle. The non-emissive Group I elements 15 and 25 may be included in an amount of greater than or equal to about 0.001 mol based on 100 mol of the emissive nanocrystal particle. The non-emissive Group I elements 15 and 25 may be included in an amount of less than or equal to about 20 parts by weight based on 100 parts by weight of the emissive nanocrystal particle. The non-emissive Group I elements 15 and 25 may be included in an amount of greater than or equal to about 0.001 parts by weight based on 100 parts by weight of the emissive nanocrystal particle.

A location, a form, or the like of the non-emissive Group I elements 15 and 25 are examined by using X-ray photoelectron spectroscopy (XPS), energy dispersive spectrometry (EDS), time of flight secondary Ion mass spectrometry (TOF-SIMS), or the like.

The Group III-V compound of the first semiconductor nanocrystal may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound of the first semiconductor nanocrystal may include two different kinds of Group III-V compounds.

The Group III-V compound of the first semiconductor nanocrystal may further include a Group II element. Herein, the first semiconductor nanocrystal may for example include InZnP or the like.

The shell 13 may include a Group III-V compound, a Group II-VI compound, a Group IV-VI compound, a Group IV element or compound, or a combination thereof. The Group III-V compound included in the shell 13 may be different from the Group III-V compound forming the core 11.

The Group III-V compound of the shell 13 may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group II-VI compound may include a binary element compound including CdSe, CdTe, ZnO, ZnS, ZnSe, ZnTe, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof, and the Group IV element or compound may include an elementary substance material including Si, Ge, or a combination thereof; or a binary element compound including SiC, SiGe, or a combination thereof.

The shell 13 may include a material having a different composition from that of the first semiconductor nanocrystal and a larger bandgap than that of the first semiconductor nanocrystal.

The shell 13 may be a multi-layered shell including at least two layers having a different composition from one another.

The multi-layered shell may include a first shell near or adjacent to the core and a second shell surrounding the first shell, and herein, the first shell may have a larger bandgap than that of the core but a smaller bandgap than that of the second shell.

A shell near or adjacent to the core may have a larger bandgap than that of an outer shell in the multi-layered shell having at least two layers.

Semiconductor nanocrystals may be capable of controlling their energy bandgaps depending on the sizes and the compositions of the semiconductor nanocrystals and may have high color purity in terms of photoluminescence characteristics, and thus semiconductor nanocrystals have attracted attention as a material that may be utilized in various fields such as a display, the energy industry, the semiconductor industry, and biology related applications. However, most types of the semiconductor nanocrystals showing satisfactory properties include cadmium (Cd). Since cadmium (Cd), mercury, or lead (Pb) is an element causing a serious environmental problem, an amount of lead (Pb) may be restricted to 1,000 parts per million (ppm) or less, an amount of cadmium (Cd) may be restricted to 100 ppm or less, and an amount of mercury (Hg) may be restricted to 1,000 ppm or less under a restriction of hazardous substances (RoHS). Therefore, it is desirable to develop a cadmium-free semiconductor nanocrystal having improved photoluminescence characteristics. A Group III-V nanocrystal is an example of a Cd-free semiconductor nanocrystal, but the synthesis process for a Group III-V nanocrystal requires a precursor that is far more susceptible to oxidation than a synthesis process for a Cd semiconductor nanocrystal (e.g., a CdSe semiconductor nanocrystal) and the precursor thereof has poor reactivity, making the control of the reaction more difficult. An InP/ZnS core-shell semiconductor nanocrystal is an exemplary Group III-V nanocrystal. However, the InP based semiconductor nanocrystals tend to exhibit unsatisfactory photoluminescence efficiency and a relatively wide full width at half maximum (FWHM). For example, InP has quantum efficiency of less than or equal to 10%, InP/ZnS has quantum efficiency of 60%, and InP and InP/ZnS are reported to have a full width at half maximum (FWHM) of 60 nm (refer to J. Mater. Chem., 18, 2653, (2008)). In addition, particle uniformity is not excellent, and thus photoluminescence uniformity is deteriorated.

However, the emissive nanocrystal particles 10 and 20 according to the embodiments may have excellent photoluminescence characteristics, for example, high photoluminescence efficiency and a narrow full width at half maximum (FWHM) by introducing a Group I element into the inside of the core 11 of the first semiconductor nanocrystal (e.g., InP, InZnP, and the like) or the interface of the core 21 and the shell 13.

The emissive nanocrystal particles 10 and 20 may absorb light at a wavelength ranging from about 300 nm to about 700 nm and thus emit light at a particular wavelength, for example, at a wavelength ranging from about 400 nm to about 600 nm, about 600 nm to about 700 nm, or about 550 nm to about 650 nm. The photoluminescence wavelength may be easily controlled depending on compositions of the emissive nanocrystal particles 10 and 20, their sizes, and/or the like.

The emissive nanocrystal particles 10 and 20 may show quantum efficiency ranging from about 70% to about 100%, for example, of greater than or equal to about 80% or greater than or equal to about 90%. The emissive nanocrystal particles 10 and 20 have less than or equal to about 45 nm, for example, less than or equal to about 40 nm of a full width at half maximum (FWHM) of photoluminescence spectra and thus may provide a display having improved color purity or color reproducibility.

The emissive nanocrystal particles 10 and 20 may have a particle size (diameter when the the emissive nanocrystal particles have a spherical shape, or the longest length when the emissive nanocrystal particles have no spherical shape) ranging from about 1 nm to about 100 nm, for example, about 1 nm to about 20 nm.

The emissive nanocrystal particles 10 and 20 may have any shape without a particular limit. For example, a nanocrystal may have a spherical shape, a pyramid shape, a multi-arm shape, or a cubic shape. The emissive nanocrystal particles 10 and 20 may have a shape such as a nanoparticle, a nanotube, a nanowire, a nanofiber, a nano sheet, or the like.

The emissive nanocrystal particles 10 and 20 may further include a ligand compound attached to a surface of the emissive nanocrystal particle.

The ligand compound may be any of ligand compounds known in the art without particular limitation. For example, the ligand compound may include RCOOH, $RNH_2$, $R_2NH$, $R_3N$, RSH, $R_3PO$, $R_3P$, ROH, RCOOR', $RPO(OH)_2$, $R_2POOH$, wherein, R and R' are the same or different, and are independently a C1 to C24 alkyl group, a C2 to C24 alkenyl group, or a C6 to C20 aryl group, or a combination thereof. The organic ligand compound may coordinate, e.g., attach to, the surface of the nanocrystals as prepared, helping disperse the nanocrystals well in a solution, and the organic ligand compound may have an effect on the light-emitting and electrical characteristics of the nanocrystals. Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as methyl phosphine, ethyl phosphine, propyl phosphine, butyl phosphine, or pentyl phosphine; a phosphine oxide compound such as methyl phosphine oxide, ethyl phosphine oxide, propyl phosphine oxide, or butyl phosphine oxide; diphenyl phosphine, triphenyl phosphine, or an oxide thereof; and a phosphonic acid, but is not limited thereto. The organic ligand compound may be used alone or in a combination of two or more.

Hereinafter, a method of preparing the emissive nanocrystal particle is described.

A method of preparing the emissive nanocrystal particle includes mixing a core precursor of a Group III element, a precursor of a Group I element, a ligand compound, and a solvent to obtain a first mixture, adding a core precursor of a Group V element to the first mixture, and heating the core precursor of the Group V element and the first mixture to prepare a Group I element-containing first semiconductor nanocrystal, mixing a core precursor of a Group III element, a ligand compound, and a solvent to obtain a first mixture, adding a core precursor of a Group V element and a precursor of a Group I element to the first mixture, and heating the core precursor of the Group V element, the precursor of the Group I element, and the first mixture to obtain a Group I element-containing first semiconductor nanocrystal, or mixing a core precursor of a Group III element, a core precursor of a Group V element, a ligand compound, and a solvent, reacting the core precursor of the Group III element, the core precursor of the Group V element, the ligand compound, and the solvent to prepare a first semiconductor nanocrystal, adding a precursor of a Group I element to the first semiconductor nanocrystal, and heating the precursor of the Group I element and the first semiconductor nanocrystal to prepare a Group I element-containing first semiconductor nanocrystal;

mixing a first shell precursor of an element including a Group II element, a Group III element, a Group IV element, or a combination thereof, a ligand compound, and a solvent to obtain a second mixture; and adding the Group I element-containing first semiconductor nanocrystal and a second shell precursor of an element including a Group V element, Group VI element, or a combination thereof to the second mixture and reacting the Group I element-containing first semiconductor nanocrystal, the second shell precursor, and the second mixture to prepare a second semiconductor nanocrystal.

First, a Group I element-containing first semiconductor nanocrystal is prepared.

In an embodiment, the Group I element-containing first semiconductor nanocrystal is prepared by mixing a core precursor of a Group III element, a precursor of a Group I element, a ligand compound, and a solvent to obtain a first mixture and injecting a core precursor of a Group V element into the first mixture.

At least two kinds of each of the core precursor of the Group III element, precursor of the Group I element, and core precursor of the Group V element may be used. When at least two kinds of precursors are used, each precursor may be injected simultaneously or with a predetermined time difference at the same temperature or a difference temperature.

The core precursor of the Group III element may include a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. The core precursor of the Group III element may include trimethyl gallium, triethyl gallium, gallium acetylacetonate, gallium chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, or thallium carbonate, but is not limited thereto.

The precursor of the Group I element may be a metal salt other than a halide salt of the Group I element. The Group I element may include lithium, sodium, potassium, rubidium, cesium, or a combination thereof.

The metal salt may be an inorganic metal salt including a phosphate, a nitrate, a carbonate, or a combination thereof.

The metal salt may be an organic metal salt and the organic metal salt may include a metal carboxylate, a metal thiolate, or a combination thereof. The metal carboxylate may be a C1 to C30 aliphatic carboxylate, a C3 to C30 alicyclic carboxylate, a C6 to C30 aromatic carboxylate, for example a C1 to C20 aliphatic carboxylate, a C3 to C20 alicyclic carboxylate, a C6 to C20 aromatic carboxylate, or the like. The metal thiolate may be a C1 to C30 metal thiolate, for example a C1 to C15 metal thiolate.

The precursor of a Group I element may be used in an amount of less than or equal to about 20 mol based on 100 mol of the core precursor of the Group III element. In addition, the precursor of a Group I element may be used in an amount of greater than or equal to about 0.05 mol based on 100 mol of the first semiconductor nanocrystal. In an embodiment, the Group I element precursor may be present in an amount of about 0.05 mol to about 15 mol based on 100 mol of the first semiconductor nanocrystal. Within the range, the Group I element precursor may complement a defect on the surface of and/or inside the first semiconductor nanocrystal and thus improve photoluminescence efficiency and particle uniformity of emissive nanocrystal particles.

The first mixture may further include a core precursor of a Group II element. Herein, the first mixture may be prepared by mixing a core precursor of a Group III element, a precursor of a Group I element, a core precursor of a Group II element, a ligand compound, and a solvent. The core precursor of the Group II element may include a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. Specifically, the core precursor of the Group II element may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc stearate, or the like.

The core precursor of the Group II element may be at least two kinds. When at least two kinds of the core precursors of the Group II element are used, each precursor may be injected simultaneously or with a predetermined time difference at the same temperature or a different temperature.

The ligand compound is the same as described above.

The solvent may include C6 to C22 primary amine such as hexadecylamine; C6 to C22 secondary amine such as dioctylamine; C6 to C40 tertiary amine such as trioctyl amine; a nitrogen-containing heterocyclic compound such as pyridine; a C6 to C40 aliphatic hydrocarbon (e.g., alkane, alkene, alkyne) such as hexadecane, octadecane, octadecene, or squalene; a C6 to C30 aromatic hydrocarbon such as phenyldodecane, phenyltetradecane, or phenyl hexadecane; C6 to C22 alkyl phosphine such as trioctylphosphine; C6 to C22 alkyl phosphine oxide such as trioctyl phosphine oxide; C12 to C22 aromatic ether such as phenyl ether, or benzyl ether; or a combination thereof.

In the first mixture, each amount of the core precursor of the Group III element, the precursor of the Group I element, the ligand compound, the solvent, and optionally, the core precursor of the Group II element may be appropriately selected as desired but is not particularly limited thereto.

Optionally, the first mixture may be heated. This heating may be performed by heating the first mixture under vacuum at greater than or equal to about 40° C., for example, at greater than or equal to about 50° C., at greater than or equal to about 60° C., at greater than or equal to about 70° C., at greater than or equal to about 80° C., at greater than or equal to about 90° C., at greater than or equal to about 100° C., or at greater than or equal to about 120° C., or under a nitrogen atmosphere at greater than or equal to about 100° C., for example, greater than or equal to about 150° C., greater than or equal to about 180° C., or greater than or equal to about 200° C.

The Group I element-containing first semiconductor nanocrystal may be prepared by heating a mixture after adding the core precursor of the Group V element to the first mixture. This process provides a core including a Group I element inside a Group III-V compound. The heating process may include heating at greater than or equal to about 120° C. under vacuum or at greater than or equal to about 180° C. or greater than or equal to about 200° C. under a nitrogen atmosphere.

The core precursor of the Group V element may include a nitride, nitric acid, ammonium nitrate, alkyl phosphine, arylphosphine, alkylsilylphosphine, arsenide, arsenic oxide, arsenic halide, arsenic sulfide, or arsenic sulfate. Specific examples of the core precursor of the Group V element may include tris(trimethylsilyl) phosphine, tris(dimethylamino) phosphine, triethylphosphine, tributylphosphine, trioctylphosphine, triphenylphosphine, tricyclohexylphosphine, arsenic oxide, arsenic chloride, arsenic sulfide, arsenic sulfate, arsenic bromide, arsenic iodide, nitric acid, or ammonium nitrate, but are not limited thereto.

In an embodiment, a Group I element-containing first semiconductor nanocrystal may be prepared by mixing a core precursor of a Group III element, a ligand compound, and a solvent to obtain a first mixture and adding a core precursor of a Group V element and a precursor of a Group I element to the first mixture.

The Group I element may be present on the surface of a core by supplying the first mixture with the core precursor of the Group V element and after a predetermined time, with the precursor of the Group I element.

Specific kinds of the core precursor of the Group III element, the ligand compound, the solvent, the core precursor of the Group V element, and the precursor of the Group I element are the same as described above, and at least two kinds of each one may be used.

As illustrated above, the first mixture may be further heated.

The heating process after adding the core precursor of the Group V element and the precursor of the Group I element to the first mixture may be performed at greater than or equal to about 120° C. under vacuum or at greater than or equal to about 180° C. or 200° C. under a nitrogen atmosphere.

In addition, in an embodiment, a Group I element-containing first semiconductor nanocrystal may be prepared by mixing a core precursor of a Group III element, a core precursor of a Group V element, a ligand compound, and a solvent and reacting the core precursor of the Group III element, the core precursor of the Group V element, the ligand compound, and the solvent to manufacture, e.g., prepare, a first semiconductor nanocrystal, adding a precursor of a Group I element to the first semiconductor nanocrystal, and heating the obtained mixture.

Specific kinds of the core precursor of the Group III element, the core precursor of the Group V element, the ligand compound, the solvent, and the precursor of the Group I element are the same as described above, and at least two kinds of each one may be used.

The reaction of the core precursor of the Group III element, the core precursor of the Group V element, the ligand compound, and the solvent may be performed under vacuum at greater than or equal to about 120° C. or under a nitrogen atmosphere at greater than or equal to about 180° C. or greater than or equal to about 200° C.

Apart from the process of preparing the Group I element-containing first semiconductor nanocrystal, a second mixture is prepared by mixing a first shell precursor of an element including a Group II element, a Group III element, a Group IV element, or a combination thereof, a ligand compound, and a solvent.

The first shell precursor of the Group II element, Group III element, Group IV element, or a combination thereof may include a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. Specifically the first shell precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc stearate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, trimethyl gallium, triethyl gallium, gallium acetylacetonate, gallium chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, or thallium carbonate, but is not limited thereto. The first shell precursor may be used alone or as a mixture of two kinds or more depending on a composition of a desired second semiconductor nanocrystal.

At least two kinds of the first shell precursor may be used. When at least two kinds of the precursor are used, each precursor may be injected simultaneously or with a predetermined time difference, e.g., at different times, at the same temperature or a different temperature.

Optionally, the second mixture may be heated. This heating process may be performed by heating the second mixture under vacuum at greater than or equal to about 120° C. or under a nitrogen atmosphere at greater than or equal to about 180° C. or about 200° C.

In the second mixture, each amount of the first shell precursor, the ligand compound, and the solvent is not particularly limited but appropriately selected depending on a composition of a final second semiconductor nanocrystal.

Subsequently, an emissive nanocrystal particle may be obtained by adding the Group I element-containing first semiconductor nanocrystal and a second shell precursor of an element including a Group V element, a Group VI element, or a combination thereof to the second mixture, and then, reacting the Group I element-containing first semiconductor nanocrystal, the second shell precursor and the second mixture to prepare a second semiconductor nanocrystal.

The Group I element-containing first semiconductor nanocrystal and the second shell precursor may be sequentially or simultaneously added. When the Group I element-containing first semiconductor nanocrystal and the second shell precursor are sequentially added, the addition order is not particularly limited.

The second shell precursor of the element including a Group V element, a Group VI element, or a combination thereof may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfide, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine(Te-TPP), tris(trimethylsilyl) phosphine (TMS3P), tris(dimethylamino)phosphine (tris(dimethylamino) phosphine), triethylphosphine, tributylphosphine, trioctylphosphine, triphenylphosphine, tricyclohexylphosphine, arsenic oxide, arsenic chloride, arsenic sulfide, arsenic sulfate, arsenic bromide, arsenic iodide, nitric acid, ammonium nitrate, or the like, but is not limited thereto.

At least two kinds of the second shell precursor may be used. When at least two kinds of the precursor are used, each precursor may be injected simultaneously or with a predetermined time difference at the same temperature or a different temperature.

After injecting the Group I element-containing first semiconductor nanocrystal and the second shell precursor into the second mixture, a reaction temperature of the first shell precursor and the second shell precursor is not particularly limited but appropriately determined by considering the first shell precursor, the second shell precursor, and a used solvent. For example, the reaction temperature may be in a range of about 100° C. to about 350° C., for example, about 220° C. to about 320° C.

The precursors used in a method of preparing the emissive nanocrystal particle is inexpensive and stable at room temperature (about 20° C. to about 25° C.) and thus has excellent process stability and productivity.

In addition, the first semiconductor nanocrystal has excellent particle uniformity and thus needs no size separation process. Furthermore, a yield of the first semiconductor nanocrystal may be improved, and thus overall productivity of the emissive nanocrystal particle may be improved.

The method of preparing the emissive nanocrystal particle may further include adding a non-solvent to the reaction products to separate a coordinated emissive nanocrystal particle to which the ligand compound is coordinated, e.g., attached. The non-solvent may be a polar solvent that may be mixed with the solvent used during the reaction, but is not capable of dispersing nanocrystals. The non-solvent may be selected depending on the types of the solvent being used in the reaction. For example, the non-solvent may include acetone, ethanol, butanol, isopropanol, ethanediol, water, tetrahydrofuran (THF), dimethyl sulfoxide (DMSO), diethylether, formaldehyde, acetaldehyde, a solvent having a similar solubility parameter to the foregoing solvent, or a combination thereof. The separation may be performed using centrifugation, precipitation, chromatography, or evaporation. The separated emissive nanocrystal particle may be added to a washing solvent as needed. The washing solvent is not particularly limited, and may be a solvent having a similar solubility parameter to the ligand, such as hexane, heptane, octane, chloroform, toluene, benzene, or the like In an embodiment, the emissive nanocrystal particles may be dispersed into a polymer matrix and thus prepared as a composite. The composite may include a polymer matrix; and the above emissive nanocrystal particles dispersed in the polymer matrix.

The polymer matrix may include a thiol-ene polymer, a (meth)acrylate polymer, a urethane resin, an epoxy resin, a vinyl polymer, a silicone resin, or a combination thereof. The thiol-ene polymer is described in detail in US-2012-0001217-A1, the content of which in its entirety is herein incorporated by reference. A (meth)acrylate polymer, a urethane resin, an epoxy polymer, a vinyl polymer, and a silicone resin may be synthesized by a known method, or a commercially available resin or polymer may be purchased.

An amount of the emissive nanocrystal particles in the polymer matrix may be appropriately selected but is not particularly limited. For example, the amount of the emissive nanocrystal particles in the polymer matrix may be greater than or equal to about 0.1 percent by weight (wt %) and less than or equal to about 30 wt % based on the total weight of the composite, but is not limited thereto.

The method of preparing the composite may include mixing a dispersion including the emissive nanocrystal particles with a solution including a polymer and then, removing a solvent therefrom but is not limited thereto. Alternatively, the composite may be prepared by dispersing the emissive nanocrystal particles in a monomer mixture for forming the polymer and polymerizing the finally obtained mixture.

The composite may be prepared in a form of a film. The film may have plural layers. For example, the film may have a layer formed of the composite and one transparent substrate or the composite layer between two transparent substrates.

Herein, at least one of the transparent substrates may include a barrier material inside or a barrier layer including the barrier material on at least one surface. In addition, the barrier layer including the barrier material may be disposed on the surface of the transparent substrate facing the composite layer.

Both the barrier material included inside the transparent substrate and the barrier material in the barrier layer may block the external moisture and the oxygen, simultaneously. Alternatively, the barrier material included inside the transparent substrate may block either one of external moisture or oxygen, and the barrier material in the barrier layer may block the other one of the external moisture or the oxygen. The barrier material may have less than or equal to about 0.1 cubic centimeters per square meter per day (cc/m$^2$/day) of transmittance about, e.g., of, at least either one of moisture or oxygen.

The barrier material may include at least either one of an organic material or an inorganic material. The barrier material may include layers wherein the organic material and the inorganic material are alternatively and repetitively laminated. The organic material may include thiol-ene, hybrid epoxy, polyurea, polytetrafluoroethylene (PTFE), polydimethylsiloxane (PDMS), polyvinylchloride, polycarbonate, polystyrene, polyimide, parylene, polyethyl acrylate, polymethyl methacrylate, or a combination thereof and the inorganic material may include silicon oxide, aluminum oxide, titanium oxide, indium oxide, tin oxide, indium tin oxide, tantalum oxide, zirconium oxide, niobium oxide, or a combination thereof.

The emissive nanocrystal particles obtained according to the above method may show high photoluminescence efficiency. The emissive nanocrystal particles may be applied to, e.g., used in, various devices, for example, a light emitting device, a solar cell, a bio sensor, an image sensor, various displays (e.g., liquid crystal display (LCD)), a hybrid composite, a bio label, a security-ink, various lightings, or the like.

Figure 3:
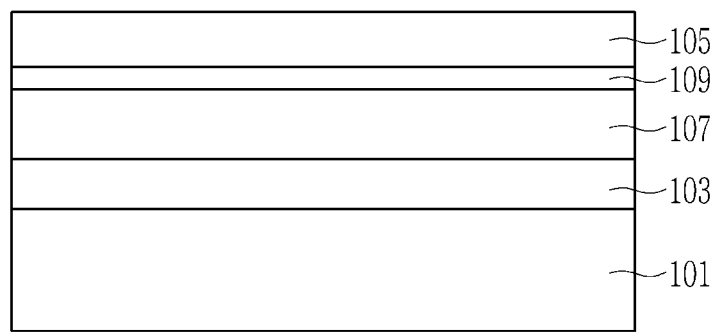
FIG. 3 is a schematic cross-sectional view of an exemplary embodiment showing a light emitting device.

A light emitting device including the emissive nanocrystal particles is illustrated, referring to FIG. 3. FIG. 3 is a schematic cross-sectional view of a light emitting device according to an embodiment. Referring to FIG. 3, a light emitting device 100 according to an embodiment includes a substrate 101, a lower electrode 103, an upper electrode 105 facing the lower electrode 103, and an emission layer 107 between the lower electrode 103 and the upper electrode 105.

The substrate 101 may be for example made of an inorganic material such as glass or an organic material such as polycarbonate, polymethyl methacrylate, polyethylene terephthalate, polyethylene naphthalate, polyamide, polyethersulfone, or a combination thereof, or the like. The substrate 101 may be for example a silicon wafer.

One of the lower electrode 103 and the upper electrode 105 may be a cathode and the other may be an anode. For example, the lower electrode 103 may be an anode and the upper electrode 105 may be a cathode.

At least either one of the lower electrode 103 and the upper electrode 105 is transparent. When the lower electrode 103 is transparent, the light emitting device may have bottom emission in which light is emitted toward the substrate 101, while when the upper electrode 105 is transparent, the light emitting device may have top emission in which light is emitted opposite the substrate 101. In addition, when the lower electrode 103 and upper electrode 105 are both transparent, light may be emitted both toward the substrate 101 and opposite the substrate 101.

The emission layer 107 may include the emissive nanocrystal particles. The emission layer 107 may emit white light by combining three primary colors such as red, green, and blue. Specifically, the emission layer 107 may emit white light by combining colors of neighboring sub-pixels in a horizontal direction or by combining laminated colors in a vertical direction.

An auxiliary layer 109 may be disposed between the emission layer 107 and the upper electrode 105 to improve photoluminescence efficiency. In the drawing, the auxiliary layer 109 is shown only between the emission layer 107 and the upper electrode 105, but is not limited thereto, and may be disposed between and emission layer 107 and the lower electrode 103, or may be disposed between the emission layer 107 and the upper electrode 105, and between the emission layer 107 and the lower electrode 103.

The auxiliary layer 109 may include an electron transport layer (ETL) and a hole transport layer (HTL) for balancing between electrons and holes, an electron injection layer (EIL) and a hole injection layer (HIL) for reinforcing injection of electrons and holes, or the like. It may include one or more layers selected therefrom.

One of the devices including the emissive nanocrystal particle may be an electronic device including a light source; and a photoconversion layer disposed on the light source, wherein the photoconversion layer includes the emissive nanocrystal particle according to an embodiment.

For example, the electronic device may be a liquid crystal display (LCD). The general structure of the liquid crystal display (LCD) is well known, and FIG. 4 shows the simplified structure.

Figure 4:
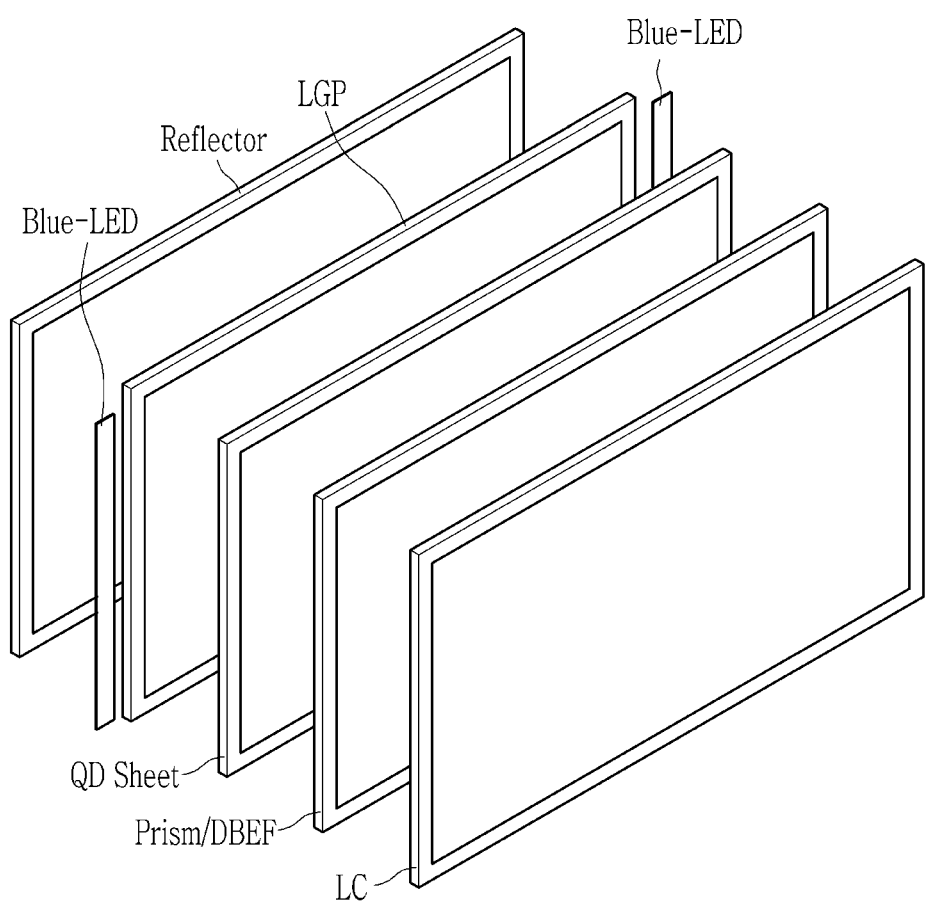
FIG. 4 is a schematic view of an exemplary embodiment showing a liquid crystal display (LCD)

Referring to FIG. 4, the liquid crystal display may have a structure that a reflector, a light guide (LGP) panel and a blue LED light source (Blue-LED), a quantum dot-polymer composite film (QD sheet), various optical films (e.g., a prism, and a double brightness enhance film (DBEF)) are stacked, and a liquid crystal (LC) panel is disposed thereon.

Hereinafter, the embodiments are illustrated in more detail with reference to examples. However, they are example embodiments of the present invention, and the present invention is not limited thereto.

EXAMPLES

Preparation Example 1: Manufacture of InP:Na Core 0.4 millimoles (mmol) of indium acetate, 1.2 mmol of palmitic acid, 0.04 mmol of sodium oleate, and 10 milliliters (mL) of trioctylamine are put in a reactor and then, heated at 120° C. under vacuum. After one hour, the atmosphere in the reactor is changed into nitrogen. After heating the reactor up to 280° C., 0.2 mmol of tris(trimethylsilyl)phosphine (TMS3P) is rapidly added thereto, and the obtained mixture is reacted. The reaction solution is rapidly cooled down to room temperature (24° C.), acetone is added thereto, and then, an InP:Na core precipitate obtained by centrifuging the obtained mixture is dispersed in toluene.

Preparation Example 2: Manufacture of InP:Na Core

An InP:Na core precipitate is manufactured according to the same method as Preparation Example 1 except for changing the amount of sodium oleate into 0.05 mmol and then, dispersed in toluene.

Preparation Example 3: Manufacture of InP:Na Core

An InP:Na core precipitate is manufactured according to the same method as Preparation Example 1 except for changing the amount of sodium oleate into 0.06 mmol and then, dispersed in toluene.

Preparation Example 4: Manufacture of InP:Na Core

An InP:Na core precipitate is manufactured according to the same method as Preparation Example 1 except for changing the amount of sodium oleate into 0.08 mmol and then, dispersed in toluene.

Preparation Example 5: Manufacture of InP:Na Core

An InP:Na core precipitate is manufactured according to the same method as Preparation Example 1 except for changing the amount of sodium oleate into 0.2 mmol and then, dispersed in toluene.

Preparation Example 6: Manufacture of InZnP:Na Core 0.6 mmol of indium acetate, 1.8 mmol of palmitic acid, 0.3 mmol of zinc oleate, 0.08 mmol of sodium oleate, and 10 mL of trioctylamine are put in a reactor and then, heated at 120° C. under vacuum. After 1 hour, the atmosphere in the reactor is changed into nitrogen. After heating the reactor up to 280° C., 0.3 mmol of tris(trimethylsilyl)phosphine (TMS3P) is rapidly added thereto, and the obtained mixture is reacted. The reaction solution is rapidly cooled down to room temperature of 24° C., acetone is added thereto, and then, an InZnP:Na core precipitate obtained by centrifuging the obtained mixture is dispersed in toluene.

Preparation Example 7: Manufacture of InP:Li Core 0.4 mmol of indium acetate, 1.2 mmol of palmitic acid, 0.08 mmol of lithium palmitate, and 10 mL of trioctylamine are put in a reactor and then, heated at 120° C. under vacuum. After 1 hour, the atmosphere in the reactor is changed into nitrogen. After heating the reactor up to 280° C., 0.2 mmol of tris(trimethylsilyl)phosphine (TMS3P) is rapidly added thereto, and the obtained mixture is reacted. The reaction solution is rapidly cooled down to room temperature of 24° C., acetone is added thereto, and then, an InP:Li core precipitate obtained by centrifuging the obtained mixture is dispersed in toluene.

Preparation Example 8: Manufacture of InZnP:Li Core 0.6 mmol of indium acetate, 1.8 mmol of palmitic acid, 0.3 mmol of zinc oleate, 0.08 mmol of lithium palmitate, and 10 mL of trioctylamine are put in a reactor and then, heated at 120° C. under vacuum. After 1 hour, the atmosphere in the reactor is changed into nitrogen. After heating the reactor up to 280° C., 0.3 mmol of tris(trimethylsilyl)phosphine (TMS3P) is rapidly added thereto. The reaction solution is rapidly cooled down to room temperature (24° C.), acetone is added thereto, and then, an InZnP:Li core precipitate obtained by centrifuging the obtained mixture is dispersed in toluene.

Comparative Preparation Example 1: Manufacture of InP Core 0.4 mmol of indium acetate, 1.2 mmol of palmitic acid, and 10 mL of trioctylamine are put in a reactor and heated at 120° C. under vacuum. After one hour, the atmosphere in the reactor is changed into nitrogen. After heating the reactor up to 280° C., 0.2 mmol of tris(trimethylsilyl)phosphine (TMS3P) is rapidly injected thereinto, and the mixture is reacted. After rapidly cooling down the reaction solution to room temperature (24° C.), acetone is added thereto, and an InP core precipitate obtained by centrifuging the mixture is dispersed in toluene.

Comparative Preparation Example 2: Manufacture of InZnP Core 0.6 mmol of indium acetate, 1.8 mmol of palmitic acid, 0.3 mmol of zinc oleate, and 10 mL of trioctylamine are put in a reactor and heated at 120° C. under vacuum. After one hour, the atmosphere in the reactor is changed into nitrogen. After heating the reactor up to 280° C., 0.3 mmol of tris(trimethylsilyl)phosphine (TMS3P) is rapidly injected thereinto and then, reacted. The reaction solution room is rapidly cooled down to room temperature (24° C.), acetone is added thereto, and an InZnP core precipitate obtained by centrifuging the mixture is dispersed in toluene.

Example 1: Manufacture of InP:Na/ZnSeS Emissive Nanocrystal Particle 0.9 mmol of zinc acetate, 1.8 mmol of oleic acid, and 10 mL of trioctylamine are put in a reactor and then, vacuum-treated at 120° C. for 10 minutes. The atmosphere in the reaction flask is substituted with nitrogen and then, heated up to 280° C. The InP:Na core toluene dispersion according to Preparation Example 1 (OD=optical density of $1^{st}$ excitonic absorption, OD=0.45) is added thereto within 10 seconds, 0.6 mmol of Se/TOP and 2.0 mmol of S/TOP are added thereto, and the obtained mixture is reacted for 120 minutes. When a reaction is complete, the resultant reaction solution is rapidly cooled down to room temperature (24° C.), ethanol is added thereto, and then, a precipitate obtained by centrifuging the mixture is dispersed in toluene to manufacture an InP:Na/ZnSeS emissive nanocrystal particle.

Example 2 to 5: Manufacture of InP:Na/ZnSeS Emissive Nanocrystal Particle

An InP:Na/ZnSeS emissive nanocrystal particle is prepared according to the same method as Example 1 except for respectively using the InP:Na cores according to Preparation Examples 2 to 5 instead of the InP:Na core according to Preparation Example 1.

Example 6: Manufacture of InZnP:Na/ZnSeS Emissive Nanocrystal Particle

An InZnP:Na/ZnSeS emissive nanocrystal particle is prepared according to the same method as Example 1 except for using the InZnP:Na core according to Preparation Example 6 as a core.

Example 7: Manufacture of InP:Li/ZnSeS Emissive Nanocrystal Particle

An InP:Li/ZnSeS emissive nanocrystal particle is manufactured according to the same method as Example 1 except for using the InP:Li core according to Preparation Example 7 as a core.

Example 8: Manufacture of InZnP:Li/ZnSeS Emissive Nanocrystal Particle

An InZnP:Li/ZnSeS emissive nanocrystal particle is manufactured according to the same method as Example 1 except for using the InZnP:Li core according to Preparation Example 8 as a core.

Comparative Example 1: Manufacture of InP/ZnSeS Emissive Nanocrystal Particle An InP/ZnSeS emissive nanocrystal particle is manufactured according to the same method as Example 1 except for using the InP core according to Comparative Preparation Example 1 as a core.

Comparative Example 2: Manufacture of
InZnP/ZnSeS Emissive Nanocrystal Particle

An InZnP/ZnSeS emissive nanocrystal particle is manufactured according to the same method as Example 1 except for using the InZnP core according to Comparative Preparation Example 2 as a core.

Optical Characteristics of Core Particles

The UV absorption curve of the core particle according to Preparation Example 1 shows a sharper UV absorption peak than that of the UV absorption curve of the core particle according to Comparative Preparation Example 1. The sharper UV absorption peak indicates that particles are uniformly distributed.

Figure 5:
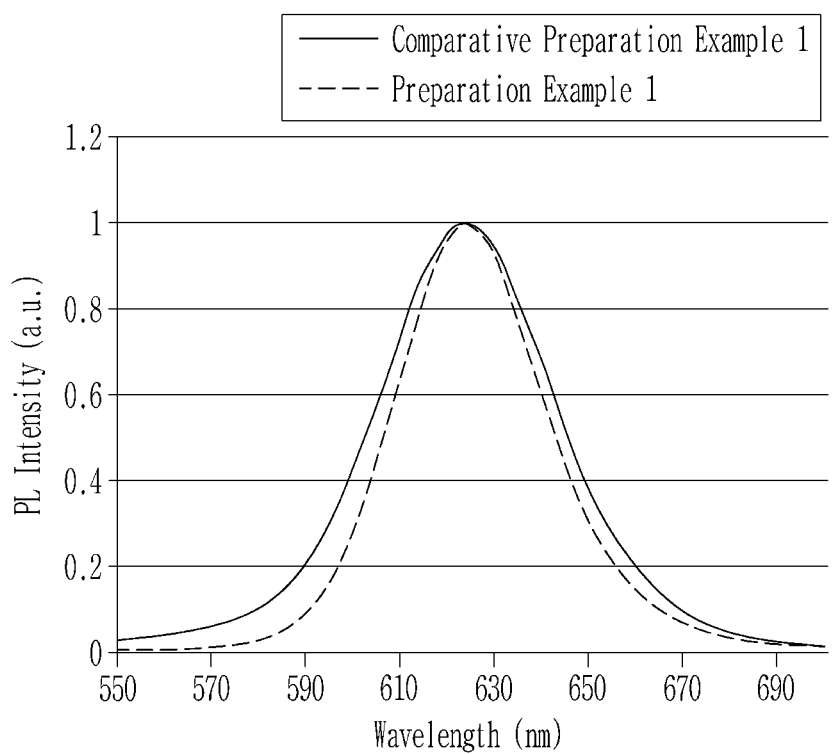
FIG. 5 is a graph showing photoluminescence (PL) spectra of the InP:Na core particle according to Preparation Example 1 and the InP core particle according to Comparative Preparation Example 1.

FIG. 5 shows PL (photoluminescence) spectra of the InP:Na core particle according to Preparation Example 1 and the InP core particle of Comparative Preparation Example 1. Referring to FIG. 5, a maximum light emitting wavelength of the core particle according to Preparation Example 1 is seen at the same wavelength as a maximum light emitting wavelength of the core particle according to Comparative Preparation Example 1, and the absorption spectrum of the core particle according to Preparation Example 1 has a narrower full width at half maximum (FWHM) than that of the core particle according to Comparative Preparation Example 1. Accordingly, Na in the InP:Na core particle according to Preparation Example 1 has no substantial influence on the maximum light emitting wavelength ($\lambda_{max}$) of the emissive nanocrystal particles but may help uniformly distribute the particles.

Confirmation of Group I Element

Figure 6:
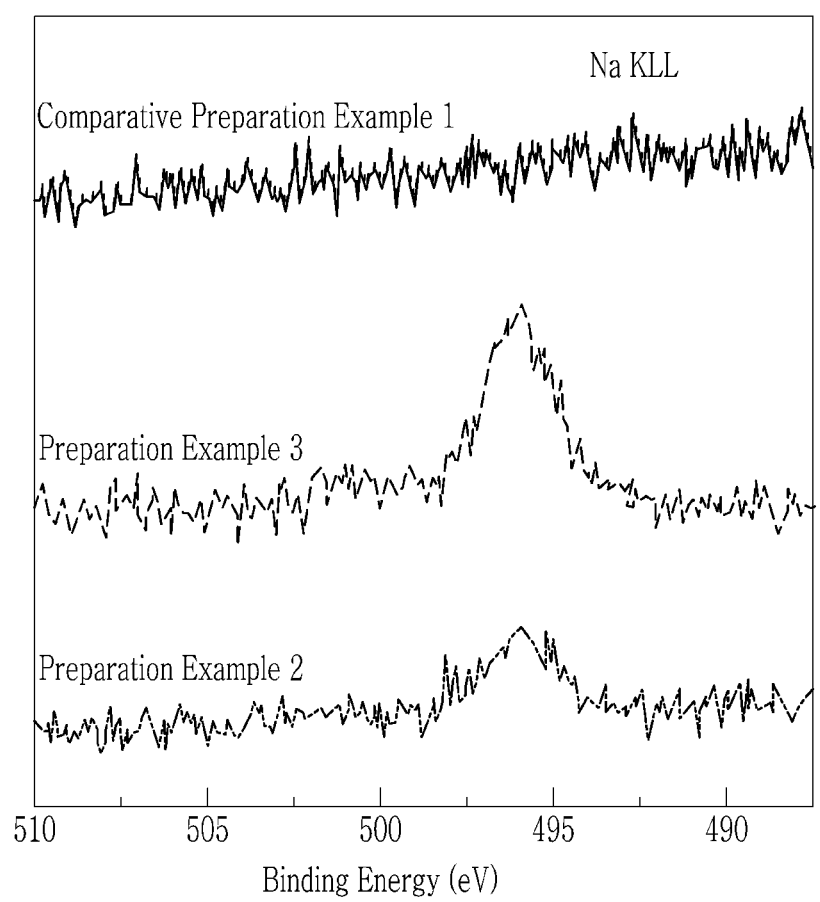
FIG. 6 shows X-ray photoelectron spectroscopy (XPS) element analysis results of core particles according to Preparation Examples 2 and 3 and Comparative Preparation Example 1.

An XPS element analysis of the core particles according to Preparation Examples 1 to 5 and Comparative Preparation Examples 1 and 2 is performed under a condition of an Al kα source (photon (X-ray) energy (hk)=1486.6 electronvolts (eV)), a minimum analysis area of 10 square micrometers, and a depth resolution of 5 to 10 nm by using Quantum 2000 made by Physical Electronics Inc. FIG. 6 shows the XPS element analysis results of the core particles according to Preparation Examples 2 and 3 and Comparative Preparation Example 1.

Referring to FIG. 6, a peak corresponding to Na KLL confirms a Na presence in the InP:Na cores according to Preparation Examples 2 and 3. On the contrary, Na is not present in the InP core according to Comparative Preparation Example 1.

Regarding the core particle according to Preparation Example 6 and the emissive nanocrystal particle according to Example 6, presence of an element (Na) belonging to Group I is confirmed through Inductively coupled plasma atomic emission spectroscopy (ICP-AES) (ICPS-8100, Shimadzu Corp.). The results are shown in Table 1.

TABLE 1

| | ICP analysis result (relative composition) | | |
|---|---|---|---|
| | P/In | Zn/In | Na/In |
| Preparation Example 6 | 0.782 | 0.331 | 0.109 |
| Example 6 | 0.72 | 28.22 | 0.11 |
| Comparative Example 1 | 0.75 | 0 | 0 |

Referring to Table 1, presence of Na is confirmed in the core according to Preparation Example 6 and the emissive nanocrystal particle according to Example 6.

Evaluation of Photoluminescence Characteristics

Photoluminescence characteristics of the emissive nanocrystal particles (dispersed in toluene) according to Examples 1 to 8 and Comparative Examples 1 and 2 are evaluated by measuring a PL (photoluminescence) maximum light emitting wavelength, a full width at half maximum (FWHM), and quantum efficiency (QY) with a Hitachi F-7000 spectrometer (a radiation wavelength: 450 nm). The measurement results of Examples 5 and 7 and Comparative Example 1 are shown in Table 2.

The emissive nanocrystal particles according to Examples 1 to 8 and Comparative Examples 1 to 4 are respectively separated through non-solvent precipitation, centrifugation, or the like. Each of the separated emissive nanocrystal particles are mixed with a monomer combination to obtain mixtures, and the mixtures are respectively coated on a polyethylene terephthalate substrate and then covered with a silicon oxide ($SiO_2$) barrier film and cured with 100 mJ/cm$^2$ to obtain each film for an evaluation. The monomer combination is prepared by mixing pentaerythritol tetrakis(3-mercapto propionate), 1,3,5-triallyl-1,3,5-triazine-2,4,6-trione, TTT), and Irgacure 754 at a weight (e.g., gram) ratio of 0.89:0.61:0.03.

The photo-conversion efficiency (CE) is a ratio of a light dose emitted by the film for an evaluation relative to a light dose absorbed therein. The photo-conversion efficiency is calculated according to Equation 1 by obtaining a total dose (B) of exciting light (i.e., blue light of 450 nm) through an integration of a PL spectrum of the exciting light, measuring a PL spectrum of the film, and obtaining a dose (A) of a green or red light and a dose (B') of blue light emitted from the film:

Photo-conversion efficiency (%)=$A/(B-B') \times 100$    Equation 1

TABLE 2

| | Solution state | | | Film state |
|---|---|---|---|---|
| | PL maximum light emitting wavelength ($\lambda_{max}$) | FWHM (nm) | QY (%) | CE (%) |
| Example 5 | 624 | 37 | 90 | 55 |
| Example 7 | 624 | 39 | 90 | 54 |
| Comparative Example 1 | 624 | 48 | 70 | 48 |

Referring to Table 2, the films respectively including the emissive nanocrystal particles according to Examples 5 and 7 show no position change of a PL maximum light emitting wavelength, a remarkably decreased full width at half maximum (FWHM), and increased quantum efficiency compared with the film including the emissive nanocrystal particles according to Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An emissive nanocrystal particle comprising:
   a core comprising a first semiconductor nanocrystal comprising a Group III-V compound; and
   a shell comprising a second semiconductor nanocrystal surrounding the core,
   wherein the emissive nanocrystal particle comprises a non-emissive Group IA element, and the non-emissive Group IA element has no substantial influence on a maximum light emitting wavelength ($\lambda_{max}$) of the emissive nanocrystal particle.

2. The emissive nanocrystal particle of claim 1, wherein the non-emissive Group IA element is present inside the core, in an interface between the core and the shell, or a combination thereof.

3. The emissive nanocrystal particle of claim 1, wherein the non-emissive Group IA element is present in a doped state or in a form of a metal salt other than a halide salt.

4. The emissive nanocrystal particle of claim 3, wherein the metal salt comprises an inorganic metal salt comprising phosphate, nitrate, carbonate, or a combination thereof.

5. The emissive nanocrystal particle of claim 3, wherein the metal salt comprises an organic metal salt.

6. The emissive nanocrystal particle of claim 5, wherein the organic metal salt comprises a metal carboxylate, a metal thiolate, or a combination thereof.

7. The emissive nanocrystal particle of claim 1, wherein the non-emissive Group IA element is present in gaps of a crystal structure of the first semiconductor nanocrystal or is present inside an interstice between lattices of the first semiconductor nanocrystal.

8. The emissive nanocrystal particle of claim 1, wherein the non-emissive Group IA element comprises lithium, sodium, potassium, rubidium, cesium, or a combination thereof.

9. The emissive nanocrystal particle of claim 1, wherein the non-emissive Group IA element is present in an amount of greater than or equal to about 0.05 mol and less than or equal to about 20 mol based on 100 mol of the first semiconductor nanocrystal.

10. The emissive nanocrystal particle of claim 1, wherein the non-emissive Group IA element is present in an amount of greater than or equal to about 0.03 parts by weight and less than or equal to about 20 parts by weight based on 100 parts by weight of the first semiconductor nanocrystal.

11. The emissive nanocrystal particle of claim 1, wherein the non-emissive Group IA element is present in an amount of greater than or equal to about 0.001 mol and less than or equal to about 20 mol based on 100 mol of the emissive nanocrystal particle.

12. The emissive nanocrystal particle of claim 1, wherein the non-emissive Group IA element is present in an amount of greater than or equal to about 0.001 parts by weight and less than or equal to about 20 parts by weight based on 100 parts by weight of the emissive nanocrystal particle.

13. The emissive nanocrystal particle of claim 1, wherein the Group III-V compound further comprises a Group II element.

14. The emissive nanocrystal particle of claim 1, wherein the Group III-V compound comprises a binary element compound comprising GaN, GaP, GaAs, GaSb, AlN, AlP, AlAs, AlSb, InN, InP, InAs, InSb, or a combination thereof; a ternary element compound comprising GaNP, GaNAs, GaNSb, GaPAs, GaPSb, AlNP, AlNAs, AlNSb, AlPAs, AlPSb, InGaP, InNP, InNAs, InNSb, InPAs, InPSb, or a combination thereof; or a quaternary element compound comprising GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

15. The emissive nanocrystal particle of claim 1, wherein the shell comprises a material comprising a Group III-V compound, a Group II-VI compound, a Group IV-VI compound, a Group IV element or compound, or a combination thereof.

16. The emissive nanocrystal particle of claim 15, wherein the Group II-VI compound comprises a binary element compound comprising CdSe, CdTe, ZnO, ZnS, ZnSe, ZnTe, HgS, HgSe, HgTe, MgSe, MgS, or a combination thereof; a ternary element compound comprising CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound comprising HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, the Group IV-VI compound comprises a binary element compound comprising SnS, SnSe, SnTe, PbS, PbSe, PbTe, or a combination thereof; a ternary element compound comprising SnSeS, SnSeTe, SnSTe, PbSeS, PbSeTe, PbSTe, SnPbS, SnPbSe, SnPbTe, or a combination thereof; or a quaternary element compound comprising SnPbSSe, SnPbSeTe, SnPbSTe, or a combination thereof, and the Group IV element or compound comprises an elementary substance comprising Si, Ge, or a combination thereof; or a binary element compound comprising SiC, SiGe, or a combination thereof.

17. The emissive nanocrystal particle of claim 1, wherein the shell comprises a material having a different composition from the first semiconductor nanocrystal and having a larger bandgap than the first semiconductor nanocrystal.

18. The emissive nanocrystal particle of claim 1, wherein the shell comprises a multi-layered shell having at least two layers wherein each of the layers has a different composition.

19. The emissive nanocrystal particle of claim 18, wherein the multi-layered shell comprises a first shell adjacent to the core and a second shell surrounding the first shell, and a bandgap of the first shell is larger than a bandgap of the core and less than a bandgap of the second shell.

20. The emissive nanocrystal particle of claim 1, wherein the emissive nanocrystal particle further comprises a ligand compound attached to a surface of the emissive nanocrystal particle.

21. The emissive nanocrystal particle of claim 20, wherein the ligand compound comprises RCOOH, RNH$_2$, R$_2$NH, R$_3$N, RSH, R$_3$PO, R$_3$P, ROH, RCOOR', RPO(OH)$_2$, R$_2$POOH, wherein, R and R' are the same or different, and are independently a C1 to C24 alkyl group, a C2 to C24 alkenyl group, or a C6 to C20 aryl group, or a combination thereof.

22. The emissive nanocrystal particle of claim 1, wherein the emissive nanocrystal particle has a full width at half maximum of less than or equal to about 45 nanometers in its photoluminescent spectrum.

23. A method of preparing the emissive nanocrystal particle of claim 1, the method comprising:

preparing a Group I element-containing first semiconductor nanocrystal, preparing the Group I element-containing first semiconductor nanocrystal comprising:

mixing a core precursor of a Group III element, a precursor of a Group I element, a ligand compound, and a solvent to obtain a first mixture, adding a core precursor of a Group V element to the first mixture, and heating the core precursor of the Group V element and the first mixture, mixing a core precursor of a Group III element, a ligand compound, and a solvent to obtain a first mixture, adding a core precursor of a Group V element and a precursor of a Group I element to the first mixture, and heating the core precursor of the Group V element, the precursor of the Group I element, and the first mixture, or mixing a core precursor of a Group III element, a core precursor of a Group V element, a ligand compound, and a solvent and reacting the core precursor of the Group III element, the core precursor of the Group V element, the ligand compound, and the solvent to prepare a first semiconductor nanocrystal, adding a precursor of a Group I element to the first semiconductor nanocrystal, and heating the first semiconductor nanocrystal and the precursor of the Group I element;

mixing a first shell precursor of an element comprising a Group II element, a Group III element, a Group IV element, or a combination thereof, a ligand compound, and a solvent to obtain a second mixture; and adding the Group I element-containing first semiconductor nanocrystal and a second shell precursor of an element comprising a Group V element, a Group VI element, or a combination thereof to the second mixture and reacting the Group I element-containing first semiconductor nanocrystal, the second shell precursor, and the second mixture to prepare a second semiconductor nanocrystal.

24. The method of claim 23, further comprising heating the first mixture, heating the second mixture, or a combination thereof.

25. The method of claim 23, wherein the core precursor of the Group III element comprises a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

26. The method of claim 23, wherein the core precursor of the Group V element comprises a nitride, nitric acid, ammonium nitrate, alkyl phosphine, arylphosphine, alkylsilylphosphine, arsenide, arsenic oxide, arsenic halide, arsenic sulfide, or arsenic sulfate.

27. The method of claim 23, wherein the precursor of the Group I element comprises a metal salt other than a halide salt of the Group I element, and the Group I element comprises lithium, sodium, potassium, rubidium, cesium, or a combination thereof.

28. The method of claim 27, wherein the metal salt comprises an inorganic metal salt comprising a phosphate, a nitrate, a carbonate, or a combination thereof.

29. The method of claim 27, wherein the metal salt comprises an organic metal salt.

30. The method of claim 29, wherein the organic metal salt comprises a metal carboxylate, a metal thiolate, or a combination thereof.

31. The method of claim 23, wherein the first mixture further comprises a core precursor of a Group II element.

32. A composite comprising:
a polymer matrix; and
the emissive nanocrystal particle of claim 1 dispersed in the polymer matrix.

33. The composite of claim 32, wherein the composite has a form of a film.

34. The composite of claim 32, wherein the polymer matrix comprises a thiol-ene polymer, a (meth)acrylate polymer, a urethane resin, an epoxy resin, a vinyl polymer, a silicone resin, or a combination thereof.

35. A device comprising the emissive nanocrystal particle of claim 1.

36. The device of claim 35, wherein the device comprises:
a light source; and
a photoconversion layer disposed on the light source,
wherein the photoconversion layer comprises the emissive nanocrystal particle.

37. The device of claim 35, wherein the device comprises a lower electrode, an upper electrode facing the lower electrode, and an emission layer between the lower electrode and the upper electrode,
wherein the emission layer comprises the emissive nanocrystal particle.

* * * * *